US009525939B2

(12) United States Patent
Berthelsen et al.

(10) Patent No.: US 9,525,939 B2
(45) Date of Patent: Dec. 20, 2016

(54) OVERHEAT PROTECTOR AND PROTECTION METHODOLOGY FOR ELECTRODYNAMIC LOUDSPEAKERS

(71) Applicant: ANALOG DEVICES GLOBAL, Hamilton (BM)

(72) Inventors: Kim Spetzler Berthelsen, Køge (DK); Kasper Strange, København Ø (DK)

(73) Assignee: Analog Devices Global, Hamilton (BM)

( * ) Notice: Subject to any disclaimer, the term of this patent is extended or adjusted under 35 U.S.C. 154(b) by 23 days.

(21) Appl. No.: 14/511,955

(22) Filed: Oct. 10, 2014

(65) Prior Publication Data

US 2016/0105746 A1 Apr. 14, 2016

(51) Int. Cl.

| | |
|---|---|
| ***H03G 11/00*** | (2006.01) |
| ***H04R 3/00*** | (2006.01) |
| *H04R 29/00* | (2006.01) |
| *H04R 9/06* | (2006.01) |

(52) U.S. Cl.

CPC ................. *H04R 3/007* (2013.01); *H04R 9/06* (2013.01)

(58) Field of Classification Search

CPC ..... H04R 3/007; H04R 29/001; H04R 29/003; H04R 3/002; H04R 3/00; H04R 3/02; H04R 9/022; H03F 1/52; H03F 2200/447; H03F 2200/462; H03F 2200/471; H03F 3/181; H03G 11/04

USPC ................................ 381/55, 58–59; 330/284

See application file for complete search history.

(56) References Cited

U.S. PATENT DOCUMENTS

| | | | | |
|---|---|---|---|---|
| 6,940,981 | B2 | 9/2005 | Neunaber | |
| 8,259,953 | B2 | 9/2012 | Jensen et al. | |
| 2011/0194705 | A1 | 8/2011 | Gautama | |
| 2011/0228945 | A1* | 9/2011 | Mihelich ................ | H04R 3/002 381/59 |
| 2012/0020488 | A1* | 1/2012 | Huijser .................. | H04R 3/007 381/59 |

(Continued)

*Primary Examiner* — Paul S Kim
*Assistant Examiner* — Norman Yu
(74) *Attorney, Agent, or Firm* — Schwegman Lundberg & Woessner, P.A.

(57) ABSTRACT

The present invention relates in one aspect to a voice coil temperature protector for electrodynamic loudspeakers. The voice coil temperature protector comprises an audio signal input for receipt of an audio signal supplied by an audio signal source and a probe signal source for generation of a low-frequency probe signal. A signal combiner is configured to combine the audio signal with the low-frequency probe signal to provide a composite loudspeaker drive signal comprising an audio signal component and a probe signal component. The voice coil temperature protector comprises a current detector configured for detecting a level of a probe current component flowing through the voice coil in response to the composite loudspeaker drive signal and a current comparator which is configured to comparing the detected level of the probe current component with a predetermined probe current threshold. The predetermined probe current threshold corresponds to a predetermined voice coil temperature via a known temperature dependency of a voice coil resistance. The voice coil temperature protector further comprises a signal controller configured for attenuating a level of the audio signal in response to the probe current component falls below the predetermined probe current threshold.

29 Claims, 8 Drawing Sheets

(56) References Cited

U.S. PATENT DOCUMENTS

2014/0126730 A1* 5/2014 Crawley .............. H04R 29/001 381/59
2014/0254805 A1* 9/2014 Su .......................... H04R 3/007 381/55

* cited by examiner

200

OVERHEAT PROTECTOR AND PROTECTION METHODOLOGY FOR ELECTRODYNAMIC LOUDSPEAKERS

The present invention relates in one aspect to a voice coil temperature protector for electrodynamic loudspeakers. The voice coil temperature protector comprises an audio signal input for receipt of an audio signal supplied by an audio signal source and a probe signal source for generation of a low-frequency probe signal. A signal combiner is configured to combine the audio signal with the low-frequency probe signal to provide a composite loudspeaker drive signal comprising an audio signal component and a probe signal component. The voice coil temperature protector comprises a current detector configured for detecting a level of a probe current component flowing through the voice coil in response to the composite loudspeaker drive signal and a current comparator which is configured to comparing the detected level of the probe current component with a predetermined probe current threshold. The predetermined probe current threshold corresponds to a predetermined voice coil temperature via a known temperature dependency of a voice coil resistance. The voice coil temperature protector further comprises a signal controller configured for attenuating a level of the audio signal in response to the probe current component falls below the predetermined probe current threshold.

BACKGROUND OF THE INVENTION

The present invention relates to a method of protecting a voice coil of an electrodynamic loudspeaker against overheating and a corresponding voice coil temperature protector. Methodologies and devices for protecting electrodynamic loudspeakers against voice coil overheating are highly useful for numerous sound reproduction purposes and applications. Proper voice coil overheat protection is useful to prevent irreversible damage or complete failure of the electrodynamic loudspeaker when driven by powerful output amplifiers. The latter may be able force excessive levels of power into the voice coil of the loudspeaker and drive the temperature of the voice coil above a maximum temperature limit. This overheat protection challenge is of continued importance in numerous areas of loudspeaker technology such as high power loudspeakers for public address systems, automotive speaker and domestic Hi-Fi as well as for miniature loudspeakers of portable communication devices such as smartphones, laptop computers etc.

Hence, it is of significant interest and value to provide a relatively simple and effective methodology and apparatus for protecting the voice coil against overheating without relying on extensive use of complex mathematical operations like division and multiplication operations which require considerable computing resources of a signal processor carrying out the protection methodology.

SUMMARY OF THE INVENTION

A first aspect of the invention relates to a method of protecting a voice coil of an electrodynamic loudspeaker against overheating, comprising steps of:

a) generating an audio signal, b) adding a low-frequency probe signal to the audio signal to generate a composite loudspeaker drive signal comprising an audio signal component and a probe signal component, c) applying the composite drive signal to the voice coil of the electrodynamic loudspeaker, d) detecting a level of a probe current component flowing through the voice coil, e) comparing the detected level of the probe current component with a predetermined probe current threshold, where the predetermined probe current threshold corresponds to a predetermined voice coil temperature via a known temperature dependence of a voice coil resistance, f) attenuating a level of the audio signal in response to the probe current component falls below the predetermined probe current threshold.

The skilled person will understand that the present methodology for overheat protection of electrodynamic loudspeakers may be applied to various types of electrodynamic loudspeaker such as loudspeakers for Hi-Fi, PA, automotive and surround sound applications. Electrodynamic loudspeakers exist in numerous shapes, dimensions and power handing capabilities and the skilled person will appreciate that the present invention is applicable to virtually all types of electrodynamic loudspeakers, in particular to miniature electrodynamic loudspeakers for sound reproduction in portable terminals such as mobile phones, smartphones and other portable music playing equipment.

The skilled person will appreciate that each of the audio signal, low-frequency probe signal and probe current component may be represented by an analog signal for example as a voltage, current, charge etc. or alternatively be represented by a digital signal, e.g. coded in binary format at a suitable sample rate and resolution. Hence, the method of overheat protecting the voice coil may comprise a step of: sampling the probe current component and/or the audio signal by an ND converter to provide at least a digitally encoded probe current component.

The low-frequency probe signal may comprise a sine wave with a frequency between 0.5 Hz and 400 Hz depending on electroacoustic characteristics of the electrodynamic loudspeaker in question. Alternatively, the low-frequency probe signal may comprise narrow-band noise, such as one-third octave band noise, with a center frequency placed in the above frequency range. The low-frequency probe signal is preferably placed at a frequency well-below a fundamental resonance frequency of the electrodynamic loudspeaker to remain in a substantially flat range of the loudspeaker impedance curve such that the level of the probe current component accurately reflects a current or instantaneous DC resistance of the voice coil. The frequency, or centre frequency, of the low-frequency probe signal is preferably at least five times smaller, and preferably at least 10 or 20 times smaller, than the fundamental resonance frequency of the electrodynamic loudspeaker under nominal operating conditions such as mounted in a sealed or vented speaker enclosure of the portable terminal or mounted in free air. The frequency of the low-frequency probe signal may for example lie between 5 Hz and 400 Hz, such as between 10 Hz and 200 Hz, for a typical miniature speaker mounted in the portable terminal. The frequency of the low-frequency probe signal may for example lie between 0.25 Hz and 20 Hz, such as between 0.5 Hz and 20 Hz, for a relatively larger woofer, e.g. a diameter between 6 and 12 inches, targeted for Hi-Fi, home cinema or automotive applications.

Preferably, the frequency, or centre frequency, of the low-frequency probe signal is on the other hand sufficiently high to exhibit a period time which is less than one half of a thermal time constant of the voice coil of the electrodynamic loudspeaker. Hence, the period time of the low-frequency probe signal may be one half or less of the thermal time constant of the voice coil of the electrodynamic loudspeaker. This requirement ensures that the probe current component can be adequately sampled to avoid missing or overlooking rapid voice coil heating events for example caused by abrupt application of excessive power to the voice coil of the loudspeaker as explained in further detail below. Further considerations with respect to the selection of the frequency, or centre frequency, of the low-frequency probe signal is discussed below in connection with the appended drawings.

The composite loudspeaker drive signal may be applied to the voice coil by a suitable output or power amplifier for example a class D or class AB amplifier. The power amplifier may be pulse modulated to take advantage of the high power-conversion efficiency of pulse modulated power amplifiers. This pulse modulation may be accomplished by utilizing a switching type or class D type of output amplifier topology for example PDM or PWM output amplifiers. In the alternative, the output amplifier may comprise traditional non-switched power amplifier topologies like class A or class AB. An output impedance of the power amplifier is preferably much smaller than the DC resistance of the target loudspeaker(s) at the low-frequency probe signal. Hence, the skilled person will appreciate that the output impedance of the output amplifier may vary significantly depending upon the impedance characteristics of the electrodynamic loudspeaker(s) in question. In a number of useful embodiments of the invention, the output impedance of the output amplifier is smaller than 1.0Ω, such as smaller than 0.5Ω or 0.1Ω at the relevant frequency. This output impedance range allows the level of the probe signal voltage across the voice coil to be held relatively constant for typical loudspeaker impedances despite the temperature induced change of the DC resistance of the voice coil during operation of the loudspeaker.

The details of how the known temperature dependency of the voice coil resistance and the predetermined probe current threshold are exploited to provide overheat protection is discussed in detail below in connection with FIGS. 3A) & 3B) of the appended drawings. The DC resistance of the voice coil is typically monotonically increasing with increasing temperature due to the positive temperature coefficient of typical voice coil materials such as copper and aluminium. This means that the probe current component of the applied composite loudspeaker drive signal monotonically decreases in a predictable manner with increasing voice coil temperature for a constant or fixed probe voltage component across the voice coil as illustrated below in connection with the appended drawings. Consequently, the predetermined probe current threshold can be computed, estimated or determined such that it corresponds to the predetermined voice coil temperature. The predetermined voice coil temperature may for example correspond to a maximum operational voice coil temperature of the loudspeaker in question or a temperature a certain number of degrees below the maximum operational voice coil temperature or any other desired temperature. The maximum operational voice coil temperature may have been determined from the loudspeaker manufacturer's specification and/or laboratory measurements on one or more representative loudspeaker(s) mounted in a realistic thermal environment.

The audio signal may comprise speech and/or music supplied in analog or digital format from a suitable audio source such as radio, CD player, network player, MP3 player. The audio source may also comprise a microphone generating a real-time microphone signal in response to incoming sound.

The skilled person will appreciate that the detection of the level of the probe current component flowing through the voice coil may be accomplished in various ways in either the analog or digital domain. In one embodiment, the detection of the level of the probe current component may comprise steps of:

detecting a composite drive signal current flowing through the voice coil in response to the composite loudspeaker drive signal, bandpass filtering the composite loudspeaker drive signal current to attenuate audio signal components therein. Detecting a level of the probe signal current component from the bandpass filtered composite loudspeaker drive signal current. The bandpass filtering may be achieved by bandpass filtering a suitable voltage, current, charge etc. signal proportional to the probe current component. Thereafter, the level of the probe current component may be determined as a running average, using suitable averaging techniques and time constants, of the signal proportional to the probe current component.

The predetermined probe current threshold may be stored in digital format in a suitable data memory location of a voice coil temperature protector implementing the present overheat protection methodology. The data memory location may for example form part of a data memory, or data register, of a signal processor, such as a microprocessor or Digital Signal Processor, implementing various functions of the present overheat protection methodology. The signal processor may be configured to perform one or more of the respective signal processing functions associated with steps a)-f) of the present overheat protection methodology by executing respective sets of executable program instructions or program code.

In numerous useful embodiments of the present methodology, the audio signal and the low-frequency probe signal may be generated, added and otherwise processed in digital format at a first sample rate. The first sample rate is preferably relatively low such as between 8 kHz and 32 kHz to reduce power consumption of associated digital processing equipment and circuits.

The addition or superposition of the low-frequency probe signal and the audio signal may be performed substantially continuously during operation of the voice coil overheat protector or discontinuously/intermittently during operation of the voice coil overheat protector for example solely during certain time intervals where one or more predetermined characteristics or features of the audio signal are met. The substantial continuous addition of the low-frequency probe signal to the audio signal may induce certain audible anomalies in the subjective performance and/or objective performance of the sound reproduction of the loudspeaker. Under certain audio signal conditions, the low-frequency probe signal component of the composite loudspeaker drive signal may become audible. The low-frequency probe signal component may for example be located at frequency, or frequency range, within the audible range where the loudspeaker is capable of producing noticeable sound pressure. Depending on complex spectral and temporal characteristic of the audio signal component of the composite loudspeaker drive signal, the probe signal may become audible and objectionable to the listener or user. One embodiment of the invention solves this subjective problem, and other problems as described below with reference to the appended drawings, caused by the continuous addition of the low-frequency frequency probe signal in an efficient way without compromising the overheat protection of the loudspeaker by adjusting the level of the low-frequency probe signal in dependence of the level of the audio signal. According to one such embodiment, the methodology comprises steps of:

g) estimating a level of the audio signal, h) adjusting a level of the low-frequency probe signal in dependence of the estimated level of the audio signal.

The low-frequency probe signal may for example exclusively be added to the audio signal during active operation of the voice coil temperature protector if, or when, the level of the audio signal exceeds a predetermined level threshold. In this manner the level of the low-frequency probe signal may for example be set to a first fixed level when the level of the audio signal exceeds the predetermined level threshold and set to zero when the level of the audio signal falls below or equals the predetermined level threshold. Furthermore, by choosing an appropriate value of the predetermined level threshold, e.g. corresponding to a level of the composite loudspeaker drive signal with insufficient power to drive the voice coil close to, or above, its maximum operational temperature, the low-frequency frequency probe signal may be present in the composite loudspeaker drive signal only where there exists a real danger of voice coil overheating. Hence, when the level of the audio signal falls below the predetermined level threshold, the addition or the low-frequency probe signal may be interrupted or the level of the low-frequency probe signal may at least be attenuated with a predetermined amount and preferably to an inaudible level. The skilled person will understand that the level of the audio signal may be determined from an audio signal voltage or an audio signal current for example the level of an audio current component flowing through the voice coil. The level of the audio signal component may be estimated over a sub-band of the frequency range of the audio signal or over the entire frequency range of the audio signal. The frequency sub-band may for example be limited to a specific frequency band where the audio signal is expected to hold a majority of its power due to a priori known spectral characteristics of the audio signal.

According to one embodiment of the present methodology, level transitions from the first fixed level to the second fixed level, or vice versa, are gradual. These gradual transitions reduce possible audible artefacts which may be generated by an abrupt turn on or turn off of the low-frequency probe signal. According to this embodiment a level transition of the low-frequency probe signal from the first fixed level to the second fixed level, or vice versa, comprises an intermediate fading period exhibiting a gradual increase or decrease of level in accordance with a predetermined rate of level change. This feature is described in further detail below in connection with the appended drawings such as waveform graphs 701 and 703 of FIG. 7.

According to another embodiment of the present methodology, step f) above comprises: attenuating a level of at least a sub-band of the audio signal. Hence, the attenuation of the level of the audio signal may comprise attenuating at least a sub-band of the audio signal for example a low-frequency band below a certain cut-off frequency such as 800 Hz, 500 Hz or 200 Hz. The low-frequency band of the audio signal often possesses a large portion of a total power of the audio signal and of the composite loudspeaker drive signal as well. Hence, the attenuation of the low-frequency band will often be effective in reducing the overall electrical power applied to the voice coil of the loudspeaker. Alternatively, the audio signal may be attenuated across its entire bandwidth/frequency range either with a constant attenuation factor, e.g. 3 dB or 6 dB or 10 dB, or with a frequency dependent attenuation response. The attenuation of the level of the audio signal may be carried out by a frequency independent gain or coefficient applied to the audio signal. The frequency independent gain depends on the determined level of the probe current component, and thereby the voice coil temperature, above the temperature set by the predetermined probe current threshold. In this manner, an increasing voice coil temperature will lead to a gradually decreasing gain, i.e. larger attenuation, of the audio signal. The relationship between the frequency independent gain and the voice coil temperature may be set by suitable mathematical equation or by a table comprising corresponding values of the level of the probe current and the gain as explained in further detail below with reference to the appended drawings.

A second aspect of the invention relates to a voice coil temperature protector for electrodynamic loudspeakers. The voice coil temperature protector comprises:

an audio signal input for receipt of an audio signal supplied by an audio signal source, a probe signal source for generation of a low-frequency probe signal, a signal combiner configured to combine the audio signal with the low-frequency probe signal to provide a composite loudspeaker drive signal comprising an audio signal component and a probe signal component, a current detector configured for detecting a level of a probe current component flowing through the voice coil in response to the composite loudspeaker drive signal, a current comparator configured to comparing the detected level of the probe current component with a predetermined probe current threshold, wherein the predetermined probe current threshold corresponds to a predetermined voice coil temperature via a known temperature dependency of a voice coil resistance, a signal controller configured for attenuating a level of the audio signal in response to the probe current component exceeds the predetermined probe current threshold.

The composite loudspeaker drive signal is preferably generated by a power or output amplifier receiving a composite drive signal from an output of the signal combiner. The output amplifier may amplify or buffer the composite drive signal and provide adequate power delivery to drive the electrodynamic loudspeaker. The properties of the output amplifier have been disclosed in detail above in connection with the corresponding voice coil overheat protection methodology. The skilled person will appreciate that the current detector may comprise various types of current sensors for example a current mirror connected to an output transistor of the output amplifier or a small sense resistor coupled in series with the loudspeaker voice coil. The probe current component may accordingly be represented by a proportional/scaled sense voltage. The latter voltage may be sampled by the previously discussed ND converter to allow processing and level detection of the probe signal component in the digital domain as discussed in further detail below with reference to the appended drawings.

The voice coil temperature protector may further comprise a level detector configured to detect a level of the audio signal; and the probe signal source may be configured to adjust a level of the low-frequency probe signal in dependence of the estimated level of the audio signal. The adjustment of the level of the low-frequency probe signal may be identical to the adjustment discussed above. The level detector may be configured to detect or estimate a running average, using suitable averaging techniques and time constants, of the audio signal. The level detector may for example comprise a RMS level detector.

The current comparator of the voice coil temperature protector may comprise a non-volatile data memory holding a value of the predetermined probe current threshold. Hence, the probe current component may be digitally sampled as discussed above and compared with value of the predetermined probe current threshold by a suitably configured signal processor such as a software programmable microprocessor. The signal processor may additionally, or alternatively, comprise a software programmable or hard-wired Digital Signal Processor (DSP). The signal processor may comprise the probe signal source and the signal combiner. The audio signal source and the probe signal source may be configured to supply the audio signal and the low-frequency probe signal, respectively, in digital formats.

The audio signal source may comprise the previously discussed software programmable or hard-wired Digital Signal Processor operating inter alia as a digital audio signal source for the present voice coil temperature protector. The digital audio signal may be generated by the DSP itself or it may be retrieved from an audio file stored in a data memory associated with the voice coil temperature protector. The digital audio signal may comprise a real-time digital audio signal supplied to a DSP audio input from an external digital audio source such as a digital microphone. The real-time digital audio signal may be formatted according to a standardized serial data communication protocol such as IIC or SPI, or formatted according to a digital audio protocol such as $I^2S$, SPDIF etc.

The voice coil temperature protector may comprise an output amplifier configured for applying the composite drive signal to the voice coil of the electrodynamic loudspeaker as discussed in detail above. Hence, the output amplifier may comprise one of a pulse density modulated and pulse width modulated power stage.

A third aspect of the invention relates to a semiconductor substrate or die having a voice coil temperature protector according to any of the above-described embodiments integrated thereon. The semiconductor substrate may be fabricated in a suitable CMOS or DMOS semiconductor process.

A fourth aspect of the invention relates to a voice coil temperature protection system. The voice coil temperature protection system comprises an electrodynamic loudspeaker comprising a movable diaphragm assembly for generating audible sound in response to actuation of the diaphragm assembly; and a voice coil temperature protector, according to according to any of the above-described embodiments thereof, electrically coupled to the movable diaphragm assembly.

BRIEF DESCRIPTION OF THE DRAWINGS

Preferred embodiments of the invention will below be described in more detail in connection with the appended drawings, in which.

DETAILED DESCRIPTION OF PREFERRED EMBODIMENTS

Figure 1:
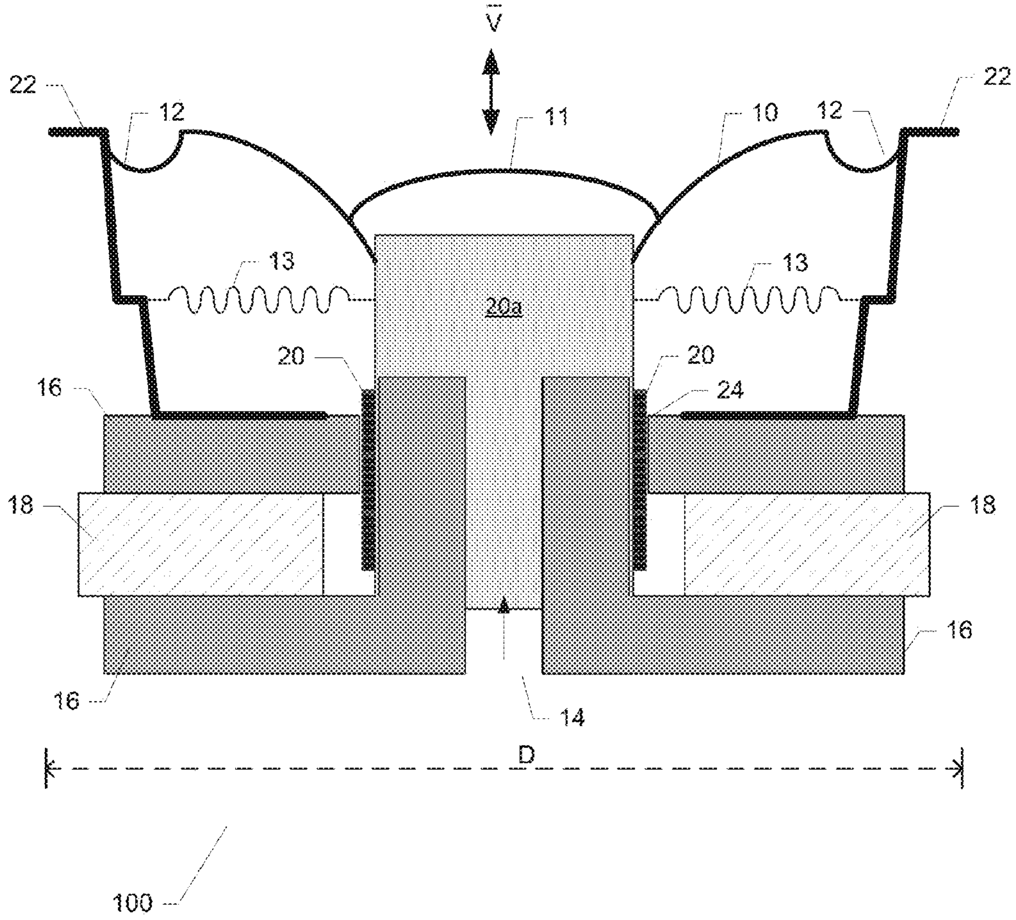
FIG. 1 is a schematic cross-sectional view of a 6.5" electrodynamic loudspeaker for various sound reproducing applications suitable for use in connection with the present invention, FIG. 2A) is a schematic cross-sectional view of an exemplary miniature electrodynamic loudspeaker suitable for sound reproduction in portable communication devices or terminals and use in connection with the present invention, FIG. 2B) is a schematic cross-sectional view of the exemplary miniature electrodynamic loudspeaker of FIG. 2A) mounted in a sealed, but leaking, loudspeaker enclosure, FIG. 3A) shows measured voice coil resistance versus voice coil temperature for the electrodynamic loudspeaker illustrated on FIG. 1 above, FIG. 3B) shows a detected level of a probe current component of a composite loudspeaker drive signal versus voice coil temperature for a constant or fixed probe signal voltage across the voice coil.

FIG. 1 is a schematic illustration of an exemplary electrodynamic loudspeaker 100 for use in various types of stationary audio applications such as Hi-Fi, automotive and home cinema. The skilled person will appreciate that electrodynamic loudspeakers exist in numerous shapes and sizes dependent on the intended type of application. The electrodynamic loudspeaker 100 used in the below described methodologies and devices for loudspeaker excursion detection and control has a diaphragm diameter, D, of approximately 6.5 inches, but the skilled person will appreciate that the present invention is applicable to virtually all types of electrodynamic loudspeakers, in particular to the miniature electrodynamic loudspeaker for sound reproduction in portable terminals such as mobile phones, smartphones and other portable music playing equipment illustrated on FIGS. 2A) and 2B).

The electrodynamic loudspeaker 100 comprises a diaphragm 10 fastened to a voice coil former 20*a*. A voice could 20 is wound around the voice coil former 20*a* and rigidly attached thereto. The diaphragm 10 is also mechanically coupled to a speaker frame 22 through a resilient edge or outer suspension 12. An annular permanent magnet structure 18 generates a magnetic flux which is conducted through a magnetically permeable structure 16 having a circular air gap 24 arranged therein. A circular ventilation duct 14 is arranged in a center of the magnetically permeable structure 16. The duct 14 may be used to conduct heat away from an otherwise sealed chamber situated beneath the diaphragm 10 and dust cap 11. A flexible inner suspension 13 is also attached to the voice coil former 20*a*. The flexible inner suspension 13 serves to align or center the position of the voice coil 20 in the air gap 24. The flexible inner suspension 13 and resilient edge suspension 12 cooperate to provide relatively well-defined compliance of the movable diaphragm assembly (voice coil 20, voice coil former 20*a* and diaphragm 10). Each of the flexible inner suspension 13 and resilient edge suspension 12 may serve to limit maximum excursion or maximum displacement of the movable diaphragm assembly.

During operation of the loudspeaker 100, a drive signal voltage is applied to the voice coil 20 of the loudspeaker 100. A corresponding voice coil current is induced in response leading to essentially uniform vibratory motion, in a piston range of the loudspeaker, of the diaphragm assembly in the direction indicated by the velocity arrow V. Thereby, a corresponding sound pressure is generated by the loudspeaker 100. The vibratory motion of the voice coil 20 and diaphragm 10 in response to the flow of voice coil current is caused by the presence of a radially-oriented magnetic field in the air gap 24. The applied voice coil current and voltage lead to power dissipation in the voice coil 20 which heats the voice coil during operation. Consequently, prolonged application of too high drive voltage/current may lead to overheating of the voice coil which is a common cause of failure or irreversible damage in electrodynamic speakers. The application of excessively large voice coil currents which force the movable diaphragm assembly beyond its maximum allowable excursion limit is another common fault mechanism in electrodynamic loudspeakers leading to various kinds of irreversible mechanical damage.

A significant source of non-linearity of the loudspeaker 100 is caused by the excursion or displacement dependent length of voice coil wire placed in the magnetic field inside the magnetic gap 24. From the schematic illustration of the loudspeaker 100 it is evident that the length of voice coil wire arranged in proximity to the magnetically permeable structure 16 tends to decrease for large positive (upwards) excursion and increase for large negative excursions of the voice coil 20. Due to this variation of the amount of magnetically permeable material close to the voice coil with voice coil/diaphragm excursion, the inductance of the voice coil 20 exhibits a similar excursion dependent variation which is utilized in the present invention as explained in further detail below.

Figure 2A:
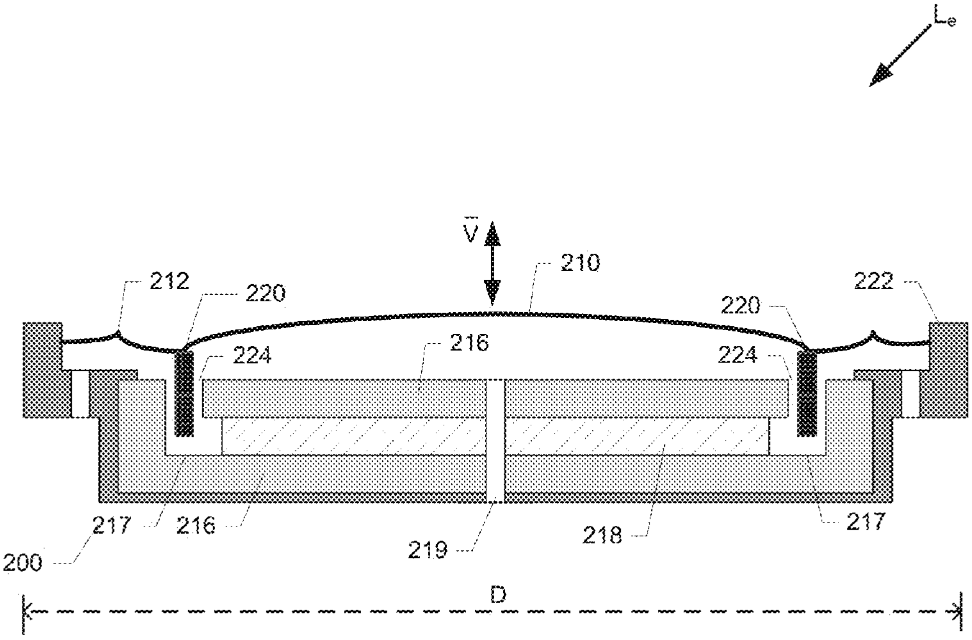

FIG. 2A) is a schematic cross-sectional view of an exemplary miniature electrodynamic loudspeaker is a schematic cross-sectional illustration of a typical miniature electrodynamic loudspeaker 200 for sealed box mounting and use in portable audio applications such as mobile phones and smartphones. The loudspeaker 200 provides sound reproduction for various types of applications such as speaker phone and music playback. The electrodynamic loudspeaker 200 used in the below described methodologies of detecting voice coil temperature has a rectangular shape with maximum outer dimension, D, of approximately 15 mm and an outer dimension in transversal direction of about 11 mm. However, the skilled person will appreciate that the present methodologies of detecting voice coil temperature and corresponding voice coil temperature detectors are applicable to virtually all types of enclosure mounted and free air and baffle mounted electrodynamic loudspeakers.

The miniature electrodynamic loudspeaker 200 comprises a diaphragm 210 fastened to an upper edge surface of a voice coil 220. The diaphragm 210 is also mechanically coupled to a speaker frame 222 through a resilient edge or outer suspension 212. An annular permanent magnet structure 218 generates a magnetic flux which is conducted through a magnetically permeable structure 216 having a circular air gap 224 arranged therein. A circular ventilation duct 219 is arranged in the frame structure 222 and may be used to conduct heat away from an otherwise sealed chamber structure formed beneath the diaphragm 210. The resilient edge suspension 212 provides a relatively well-defined compliance of the movable diaphragm assembly (voice coil 220 and diaphragm 210). The compliance of the resilient edge suspension 212 and a moving mass of the diaphragm 210 determines the free-air fundamental resonance frequency of the miniature loudspeaker. The resilient edge suspension 212 may be constructed to limit maximum excursion or maximum displacement of the movable diaphragm assembly.

During operation of the miniature loudspeaker 200, a voice coil voltage or drive voltage is applied to the voice coil 220 of the loudspeaker 200 thorough a pair of speaker terminals (not shown) electrically connected to a suitable output amplifier or power amplifier. A corresponding voice coil current flows in response through the voice coil 220 leading to essentially uniform vibratory motion, in a piston range of the loudspeaker, of the diaphragm assembly in the direction indicated by the velocity arrow V. Thereby, a corresponding sound pressure is generated by the miniature loudspeaker 200. The loudspeaker may produce useful sound pressure in a certain frequency range between about 500 Hz and 10 kHz depending on amongst other factors, dimensions of the loudspeaker enclosure and shape of the loudspeaker diaphragm. The vibratory motion of the voice coil 220 and diaphragm 210 in response to the flow of voice coil current is caused by the presence of a radially-oriented magnetic field in the air gap 224. The applied voice coil current and voltage lead to power dissipation in the voice coil 220 which heats the voice coil 220 during operation. Hence, prolonged application of too high drive voltage and current may lead to overheating of the voice coil 220 which is common cause of failure in electrodynamic loudspeakers as discussed above.

The application of excessively large voice coil currents which force the movable diaphragm assembly beyond its maximum allowable excursion limit is another common fault mechanism in electrodynamic loudspeakers leading to various kinds of irreversible mechanical damage.

Figure 2B:
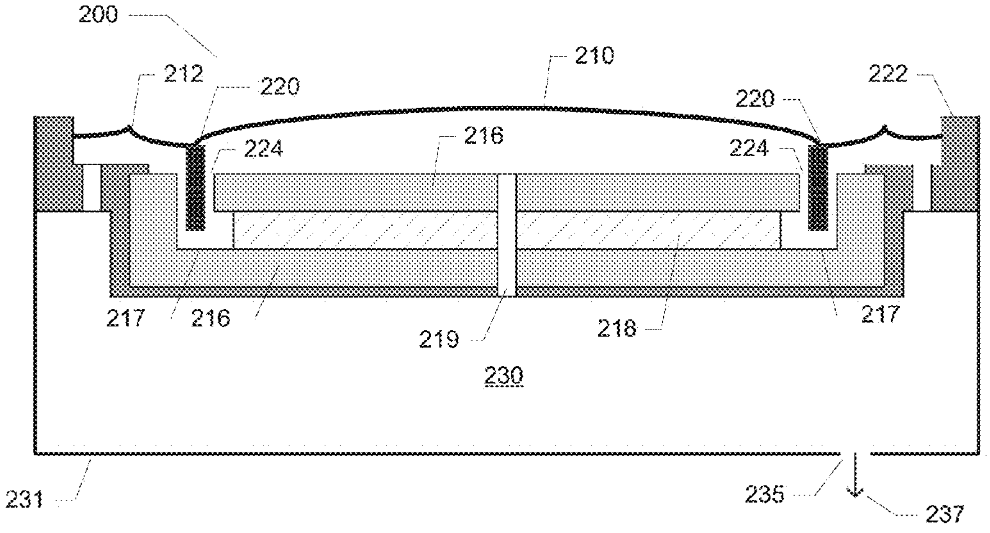

FIG. 2B) is a schematic cross-sectional illustration of the miniature electrodynamic loudspeaker 200 mounted in an enclosure, box or chamber 231 having a predetermined interior volume 230. The enclosure or chamber 231 is arranged below the diaphragm 210 of the loudspeaker 200. An outer peripheral wall of the frame structure 222 of the loudspeaker 200 is firmly attached to a mating wall surface of the sealed box 231 to form a substantially air tight coupling acoustically isolating the trapped air inside volume 230 from the surrounding environment except for the small acoustic leakage 235 discussed below. The enclosed volume 30 may be between 0.5 and 2.0 $cm^3$ such as about 1 $cm^3$ for typical portable communication device or terminal applications like mobile phones and smartphones. The mounting of the loudspeaker 200 in the sealed enclosure 230 leads to a higher fundamental resonance frequency of the miniature loudspeaker than its free-air fundamental resonance frequency discussed above due to compliance of the trapped air inside the chamber 230. The compliance of the trapped air inside the chamber 230 works in parallel with the compliance of the resilient edge suspension 212 to decrease the total compliance (i.e. increase the stiffness) acting on the moving mass of the loudspeaker. Therefore, the fundamental resonance frequency of the enclosure mounted loudspeaker 200 is higher than its free air resonance. The amount of increase of fundamental resonance frequency depends on the volume of the enclosure 230. The wall structure surrounding the sealed enclosure 231 may be a formed by a molded elastomeric compound with limited impact strength. A possible undesired small hole or crack 235 in the wall structure 231 of the enclosure 230 has been schematically illustrated and the associated acoustic leakage of sound pressure to the surrounding environment indicated by the arrow 237. The acoustic leakage through the small hole or crack 235 leads to an overall undesired leaky state of the otherwise sealed enclosure 230. This leakage tends to a decrease of the fundamental resonance frequency of the miniature loudspeaker 200 as illustrated by the impedance curves 401, 403 of the miniature loudspeaker illustrated on FIG. 4. It may be advisable to place the low-frequency probe tone at a sufficiently low frequency to remain in a flat impedance range of the impedance curves 401, 403 irrespective of the presence or absence of enclosure leakage. This ensures that the probe current level accurately reflects a DC resistance of the voice coil.

Figure 3A:
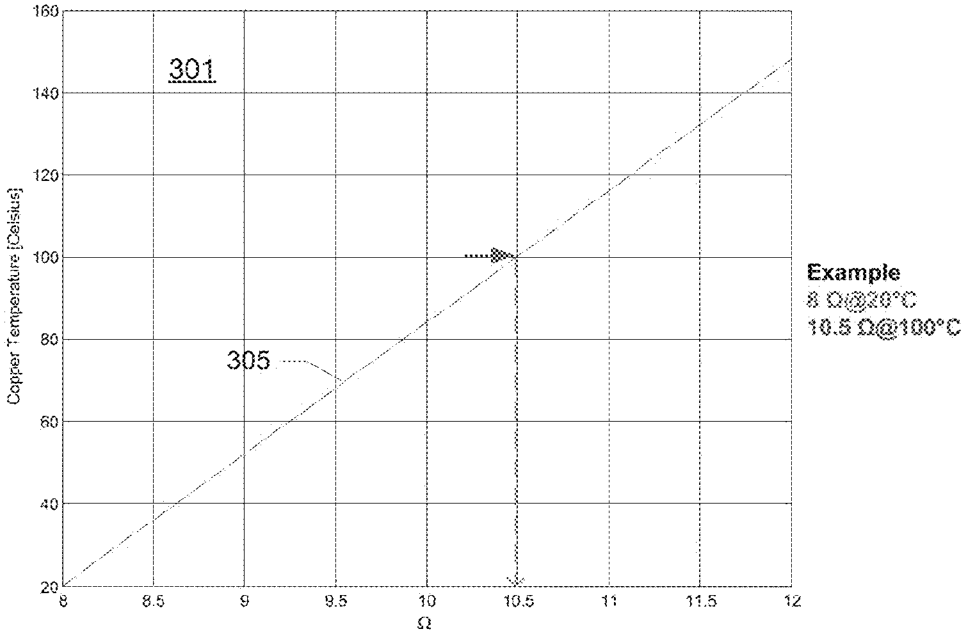

FIG. 3A) shows a graph 301 comprising a plot 305 of measured voice coil resistance versus voice coil temperature for the miniature electrodynamic loudspeaker illustrated on FIG. 2B) above. A DC resistance of the voice coil of the loudspeaker is approximately 8.0Ω at room temperature as evidenced by the measured resistance curve. The rate of change in ohm per ° C. of the voice coil resistance depends on the voice coil material which typically comprises aluminium or copper wire, or a combination thereof, wound into a multi-turn coil. As illustrated, this voice coil comprises copper windings and therefore exhibits a resistance increase from 8.0Ω at 20° C. to 10.5Ω at 100° C. This is a resistance increase of about 31% for a voice coil temperature increase of 80° C.

Figure 3B:
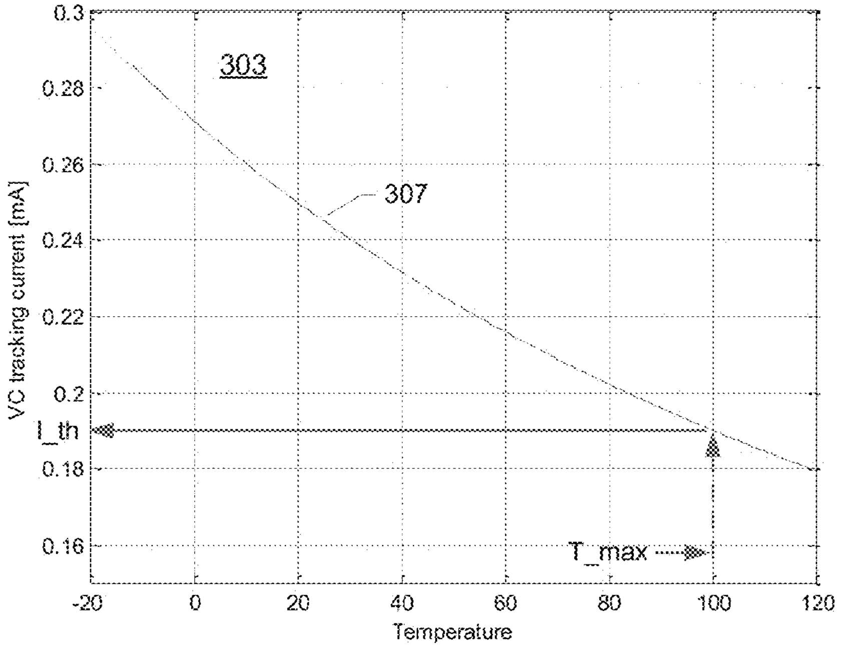

The graph 303 of FIG. 3B) comprises a plot 307 showing the level of a low-frequency probe current component flowing in the voice coil 224 of the miniature electrodynamic loudspeaker illustrated on FIGS. 2A)-2B) above the versus voice coil temperature. The plot 307 illustrates how the probe current component monotonically decreases with increasing voice coil temperature for a constant or fixed probe signal voltage across the voice coil. The decrease of the probe current component from about 0.25 mA at a voice temperature of 20° C. to about 0.19 mA at 100° C. is caused by the corresponding increase of voice coil resistance from 8Ω to 10.5Ω, as mentioned above, between these temperature points as illustrated by plot 305. If the level of the probe voltage across the voice coil is set to a substantially fixed level of e.g. 0.2 V, the above levels of the probe current component at 20° C. and 100° C. to are reached.

These observations are exploited in various embodiments of the present methodology of overheat protecting the voice coil of the electrodynamic loudspeakers illustrated on FIGS. 1 and 2A). The overheat protection preferably comprises determining or finding a maximum operational voice temperature of the loudspeaker in question and determine a corresponding probe current threshold. The probe current threshold may be set such that it correspond to the maximum voice coil temperature via a known voltage of the probe signal component and the known temperature dependency of the voice coil resistance as illustrated on FIG. 3A). As illustrated by plot 307 of FIG. 3B), the loudspeaker may for example have a maximum operational voice coil temperature of 100° C. and the latter temperature corresponds to a probe current component of about 0.19 mA for the chosen fixed voltage level of the probe signal component of the composite drive signal applied to the voice coil of the loudspeaker. Hence, the probe current threshold I_th is set equal to this value of the probe current component of about 0.19 mA on graph 303. The steps of the present methodology are described in further detail below in connection with the description of the functionality of a voice coil temperature protector.

Figure 4:
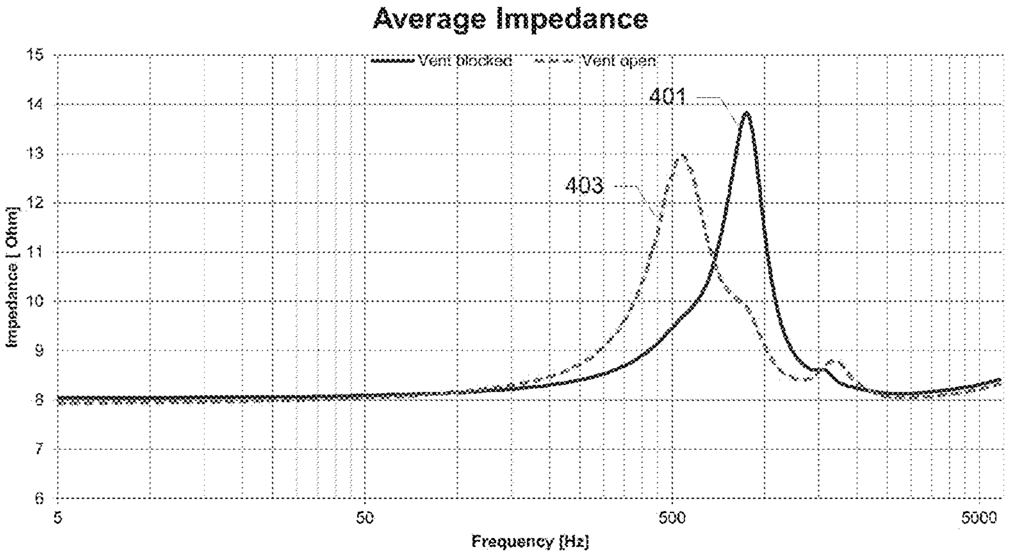
FIG. 4 is a graph of measured loudspeaker impedance versus frequency for an enclosure mounted miniature electrodynamic loudspeaker similar to the one depicted on FIG. 2A)

FIG. 4 shows, as previously mentioned, measured impedance curves 401, 403 of the miniature loudspeaker 200 mounted in the loudspeaker enclosure 231 depicted on FIG. 2B). The impedance curve 401 is for the non-leaking or sealed and nominal condition of the speaker enclosure while the impedance curve 403 represents the leaky condition. The leakage tends to lower the fundamental resonance frequency of the miniature loudspeaker 200, in this case from about 800 Hz to about 550 Hz as illustrated. The low-frequency probe tone is preferably placed at a frequency well-below the fundamental resonance frequency to remain in a substantially flat impedance range such that the probe current level accurately reflects the DC resistance of the voice coil. The low-frequency probe signal may comprise a sine wave or similar narrow-band signal with a frequency, or centre frequency, at least five times smaller than the fundamental resonance frequency of the miniature loudspeaker 200 as mounted in the speaker enclosure 231 under nominal operating conditions. In the present embodiment this constraint means that the frequency, or centre frequency, of the low-frequency probe signal is smaller than about 160 Hz.

Preferably, the frequency, or centre frequency, of the low-frequency probe signal is on the other hand sufficiently high to exhibit a period time which is less than one half of a thermal time constant of the voice coil of the miniature loudspeaker 200. This requirement ensures that the probe current component can be adequately sampled to avoid missing or overlooking rapid voice coil heating events for example caused by abrupt application of excessive power to the voice coil of the miniature loudspeaker 200. This thermal time constant may be equal to or smaller than 0.7 seconds for typical miniature loudspeaker designs. In the present embodiment, this constraint translates to a frequency, or centre frequency, of the low-frequency probe signal which preferably is higher than 2.8 Hz such as higher than 5 Hz for the thermal time constant of about 0.7 seconds.

Figure 5:
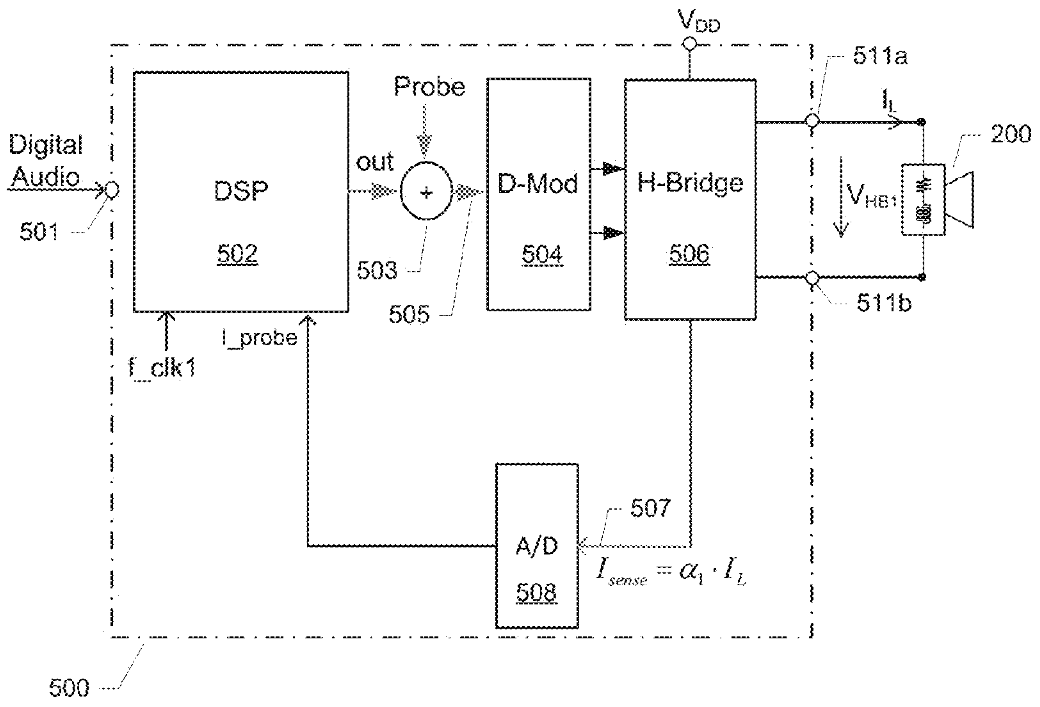
FIG. 5 shows a simplified schematic block diagram of a voice coil temperature protector for electrodynamic loudspeakers in accordance with a first embodiment of the invention.

FIG. 5 shows a schematic block diagram of a voice coil temperature protector 500 in accordance with a first embodiment of the invention coupled to the enclosure mounted miniature electrodynamic loudspeaker 200 discussed above through a pair of externally accessible speaker terminals 511*a*, 511*b*. The voice coil temperature protector 500 protects the miniature loudspeaker 200 against voice coil overheating caused by excessively large drive signals from the output amplifier 506. In the present embodiment, the voice coil temperature protector 500 operates on signals in the digital domain, but other embodiments may use analog signals or any mixture of analog and digital signals.

The voice coil temperature protector 500 comprises a digital audio signal input 501, for receipt of a digital audio signal. The digital audio signal may be derived from an external analog or digital audio source, for example a microphone, and comprise speech and/or music signals. The digital audio signal may be formatted according to a standardized serial data communication protocol such as IIC or SPI, or formatted according to a digital audio protocol such as IIS, SPDIF etc. The voice coil temperature protector 500 is supplied with operating power from a positive power supply voltage $V_{DD}$. Ground (not shown) or a negative DC voltage may form a negative supply voltage for the voice coil temperature protector 500. The DC voltage of $V_{DD}$ may vary considerably depending on the particular application of the voice coil temperature protector 500 and may typically be set to a voltage between 1.5 Volt and 100.0 Volt. The voice coil temperature protector 500 comprises a hard-wired or software programmable Digital Signal Processor (DSP) 502 that is configured to perform various types of signal generation and signal processing operations of the voice coil temperature protector 500 as explained in further detail below. The DSP 502 may be configured to internally process digital signals by a suitable sampling frequency for audio signals for example 48 kHz. The sampling frequency may be derived from a DSP clock input, f_clk1. The external DSP clock input, f_clk1 may be set to a clock frequency between 10 MHz and 100 MHz. The sampling frequency may be selected to other frequencies such as a frequency between 8 kHz and 192 kHz, in other embodiments of the invention depending on factors like desired audio bandwidth and other performance characteristics of a particular application.

A processed version of the digital audio signal is supplied at the output, out, of the DSP 502 and inputted to a first input of a signal combiner, adder or summer 503. A second input of the signal combiner 503 receives the previously discussed low-frequency probe signal such that the low-frequency probe signal is added to the digital audio signal and a composite digital audio signal is supplied at an output 505 of the signal combiner 503. The composite digital audio signal is applied to a class D output or power amplifier comprising a modulator stage 504 and a power stage 506. The skilled person will understand that the modulator stage 504 may be configured for different types of modulation such as Pulse Width Modulation (PWM), Pulse Density Modulation (PDM) etc. The power stage 506 may comprise an H-bridge as illustrated with the miniature loudspeaker terminals coupled between a pair of complementary outputs of the H-bridge. The skilled person will appreciate that numerous other output amplifier topologies may be used instead of the illustrated class D output amplifier for example class AB, class E or class A amplifier topologies. The class D output amplifier is configured to amplify or buffer the composite digital audio signal and deliver a composite loudspeaker drive signal to the voice coil of the miniature loudspeaker 200 via the pair of speaker terminals 511*a*, 511*b*. Consequently, the composite loudspeaker drive signal applied across the voice coil of the miniature electrodynamic loudspeaker 200 comprises an audio signal component and a probe signal component which are amplified or buffered versions of the corresponding signals of the composite digital audio signal at the output of the signal combiner, 503. The class D output amplifier 502 is preferably configured to exhibit an output impedance, at the pair of output terminals 511*a*, 511*b*, that is significantly lower than the DC resistance of the miniature loudspeaker 200 at the selected frequency of the low-frequency probe signal to provide an essentially constant probe voltage level across the voice coil of the miniature loudspeaker 200 despite the previously discussed temperature induced variation of the DC resistance. This essentially constant probe voltage level leads to the previously discussed (refer to graph 303 of FIG. 3B)) straight forward predictable decrease of level of the probe current component with increasing voice coil temperature. The output impedance of the class D output amplifier 502 at the low-frequency probe signal may be less than 1.0Ω, even more preferably less than 0.5Ω, such as less than 0.1 Ω.

While the signal combiner 503 is illustrated as a separate component or function on FIG. 5, the skilled person will understand that the signal combiner 503 may be integrated with the DSP 502. The signal combiner 503 may comprise a set of executable program instructions or code of the DSP 502 in combination with one or more internal DSP registers for variable storage. Furthermore, the low-frequency probe signal, Probe, may be generated by a software implemented probe signal source comprising a suitable set of executable program instructions or program code executed on the DSP 502. This software implemented probe signal source is configured to generate a sine wave probe, or possibly a narrow-band noise probe signal, with a frequency content placed inside the previously discussed preferred low-frequency ranges.

The voice coil temperature protector 500 additionally comprises a current detector (not shown) which is configured for detecting a level of a probe current component flowing through the voice coil in response to the composite loudspeaker drive signal. The a current detector comprises the schematically illustrated current sensor, by the arrow $I_{sense}$ 507, that detects a composite signal current $I_L$ flowing through the voice coil of the loudspeaker 200 in response to the presence of the composite loudspeaker drive signal supplied by the class D output amplifier 502. The skilled person will appreciate that the current sensor may comprise various types of current sensors that generate a voltage, current or charge signal proportional to the composite signal current $I_L$ in the voice coil. The current sensor may comprise a current mirror connected to an output transistor of the H-bridge 506 or a small sense resistor coupled in series with the voice coil. The composite signal current $I_L$ may accordingly be represented by a proportional/scaled sense voltage which is applied to the input of the analog-to-digital converter 508. The analog-to-digital converter 508 is adapted to digitize the measured sense voltage and provide a digital sense voltage or sense data at a sample rate fixed by the analog-to-digital converter 408 to a suitable input port I_probe of the DSP 502. The resolution of the analog-to-digital converter 408 may vary depending on how accurate value of the sense voltage has to be represented. In numerous applications, the resolution may fall between 8 and 24 bits. In one embodiment, the sampling frequency of the analog-to-digital converter 408 is set to a frequency at least two times higher than an upper frequency limit of the composite loudspeaker drive signal to ensure accurate representation thereof without aliasing errors.

The current detector preferably comprises another set of executable program instructions or program code executed on the DSP 502 to detect or determine the level of the probe current component by processing of the digital sense voltage read from the input port of the DSP 502. This latter set of executable program instructions or program code may additionally be configured to implement the comparison between the detected level of the probe current component and the predetermined probe current threshold. As mentioned previously, the probe signal may have a frequency from about 10 Hz to 160 Hz in the present embodiment which means that the probe signal may be spectrally and temporally overlapping speech and/or music signal components of the audio signal. The current detector may therefore perform bandpass filtering and/or averaging of the digital sense voltage to extract or isolate the probe current component from overlapping or interfering audio signal components or other types of noise signals. These signal types represent noise for the purpose of accurately estimating the probe current component. The level of the probe current component may be determined from the extracted or isolated probe current component by various types of averaging methodology such as a running RMS level computation or running rectified mean computation. The level of the probe current component is subsequently compared with the predetermined probe current threshold, threshold I_th on FIG. 3B), and the outcome of this comparison determines whether or not the level of the audio signal is attenuated. If the probe current component reaches or falls below the predetermined probe current threshold I_th, this implies that the maximum operational temperature T_max, i.e. 100° C. for the exemplary miniature loudspeaker 200, of the voice coil has been reached. In response, a signal controller (not shown) of the voice coil temperature protector 500 attenuates the level of the audio signal such that the level of electrical power applied to the voice coil miniature loudspeaker 200 is reduced. Otherwise, in case the probe current component is larger than I_th the audio signal is transmitted without attenuation to the class D output amplifier 504, 506 by the signal controller. The functionality of the signal controller may like the current detector comprise, or be implemented by, a set of executable program instructions or program code executed on the DSP 502. The value of the predetermined probe current threshold I_th may be stored in a processor readable memory location, address or register of the DSP 502. As discussed above, the value, e.g. 0.19 mA, of the probe current threshold may have been determined and written to a non-volatile memory location or cell of the DSP 502 during a calibration phase of the voice coil temperature protector 500. The value of probe current threshold I_th may have been determined such that it correspond to the maximum voice coil temperature via the known temperature dependency of the voice coil resistance, as illustrated on FIG. 3A) and the known relationship between the level of the probe current component and voice coil temperature as illustrated by plot 307 of FIG. 3B). The maximum voice coil temperature may have been determined from the loudspeaker manufacturer's data sheet and/or laboratory experiments on one or more representative miniature loudspeaker(s) mounted in a realistic thermal environment. The attenuation of the level of the audio signal may comprise attenuating at least a sub-band of the audio signal such as a low-frequency band below a certain cut-off frequency such as 800 Hz, 500 Hz or 200 Hz. The low-frequency band often possesses a large portion of total power of the audio signal, and total power of the composite loudspeaker drive signal as well. Hence, the attenuation will often be effective in reducing the overall electrical power applied to the voice coil of the miniature loudspeaker 200. Alternatively, the audio signal may be attenuated across its entire bandwidth/frequency range either with a constant attenuation factor, e.g. 3 dB or 6 dB or 10 dB, or with a frequency dependent attenuation response. A frequency independent gain applied to the audio signal may possess a value which depends on the determined level of the probe current component, and thereby voice coil temperature, above the temperature set by the predetermined probe current threshold I_th. Below the temperature set by the predetermined probe current threshold I_th, the frequency independent gain may be substantially constant. In this manner an increasing voice coil temperature will lead to a gradually decreasing or smaller gain, i.e. larger attenuation, of the audio signal. The relationship between the frequency independent gain and the voice coil temperature may be set by suitable mathematical equation or by a table comprising corresponding values of the level of the probe current and the gain. This gradually increasing attenuation of the audio signal above the maximum temperature of the voice coil will protect the voice coil while leaving the level of the composite drive signal sufficiently large to maintain audibility of the sound signal reproduced to the user.

The skilled person will appreciate that the straight forward comparison between the determined level of the probe current component and the stored value of the predetermined probe current threshold I_th performed by the current detector obviates the need to determine the instantaneous resistance of the voice coil by complex continuous division operations between the measured probe signal voltage and probe signal current. Hence, the present current detector saves computational resources in the DSP 502 and lowers the power consumption of the DSP 502. By a priori calculating or determining the probe current threshold such that the latter corresponds to the maximum temperature, or any another desired target temperature, of the voice coil via the known temperature dependency of the voice coil resistance, the DSP 502 only needs to compute the level of the probe current component during operation of the voice coil temperature protector.

The skilled person will appreciate that the illustrated voice coil temperature protector 500, the DSP 502 and the miniature loudspeaker 200 may form part of a complete sound reproduction system for a portable communication device with integral amplification and temperature protection.

The voice coil temperature protector 500 may be adapted to add the low-frequency probe signal to the audio signal substantially continuously when the audio signal is present at the input of the protector. However, this feature may lead to audible anomalies in the subjective performance or objective performance of the sound reproduction of the miniature loudspeaker. Under certain audio signal conditions, the low-frequency probe signal component of the composite loudspeaker drive signal may become audible. The low-frequency probe signal component may for example be located at frequency, or frequency range, within the audible range where the miniature loudspeaker 200 is capable of producing noticeable sound pressure. Depending on complex spectral and temporal characteristic of the audio signal component of the composite loudspeaker drive signal, the probe signal may become audible and objectionable to the listener or user.

Another potential problem with such a continuous low-frequency probe signal is an unintended increase of quiescent power consumption of Class D amplifier output stage. Quiescent power consumption is typically an important specification of the output amplifier that is used by manufacturers of the previously discussed sound reproduction system to evaluate and diagnose the performance of the output amplifier. However, the presence of the continuous low-frequency probe signal, despite a zero level of the audio input signal, leads to an abnormal quiescent power consumption of the output amplifier misleadingly indicating a failure of the output amplifier.

A preferred embodiment of the invention solves the above-mentioned subjective and objective problems caused by the continuous addition of the low-frequency frequency probe signal in an efficient way without compromising the protection of the miniature loudspeaker by adjusting the level of the low-frequency probe signal in dependence of the estimated level of the audio signal. The low-frequency frequency probe signal may for example exclusively be added to the audio signal during active operation of the voice coil temperature protector if, or when, the level of the audio signal exceeds a predetermined level threshold. In this manner the level of the low-frequency probe signal may for example be set to a first fixed level when the level of the audio signal exceeds the predetermined level threshold and set to zero when the level of the audio signal falls below or equals the predetermined level threshold. Hence, the above mentioned subjective and objective performance anomalies caused by the constant presence of the low-frequency frequency probe signal, even at zero audio input signal conditions, are removed. Furthermore, by choosing an appropriate value of the predetermined level threshold, e.g. corresponding to a level of the composite loudspeaker drive signal well below the thermal limit of the voice coil of the miniature loudspeaker, the low-frequency frequency probe signal may at one hand be present in the composite loudspeaker drive signal only where there is a potential danger of overheating of the voice. On the other hand, the low-frequency frequency probe signal may be absent, or at least at a small level, when the level of the composite loudspeaker drive signal is well below the thermal limit of the voice coil of the miniature loudspeaker.

The level of the audio signal may be determined from an audio signal voltage or an audio signal current for example the level of an audio current component flowing through the voice coil of the miniature loudspeaker. One advantage of using the audio signal current to estimate the audio signal level is that the low-frequency probe tone automatically becomes disabled when the miniature loudspeaker is disconnected from the voice coil temperature protector.

Figure 6:
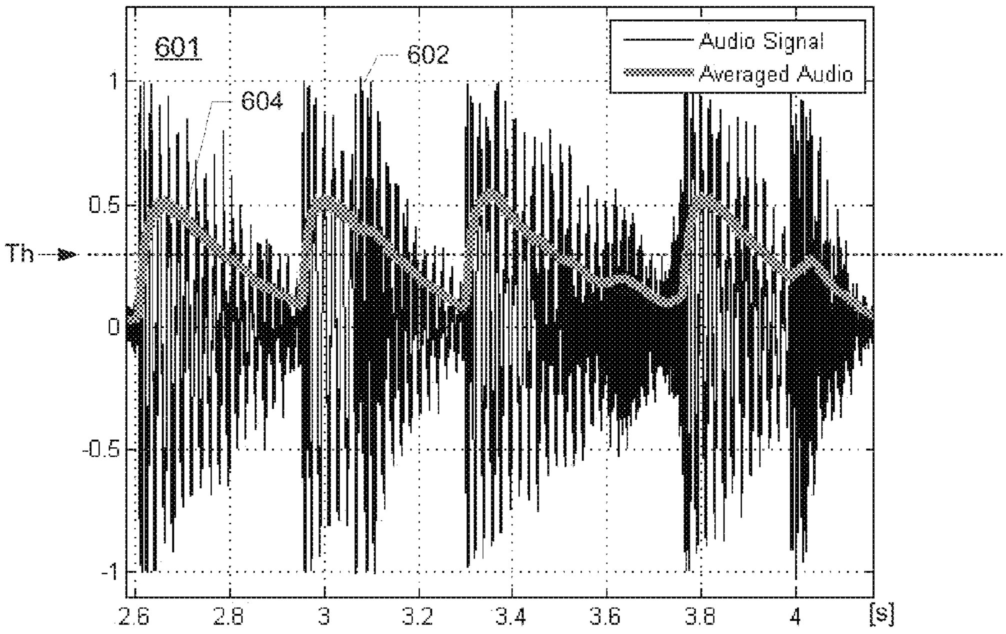
FIG. 6 shows waveforms of an exemplary audio signal and a corresponding running average level of the audio signal.
Figure 6:
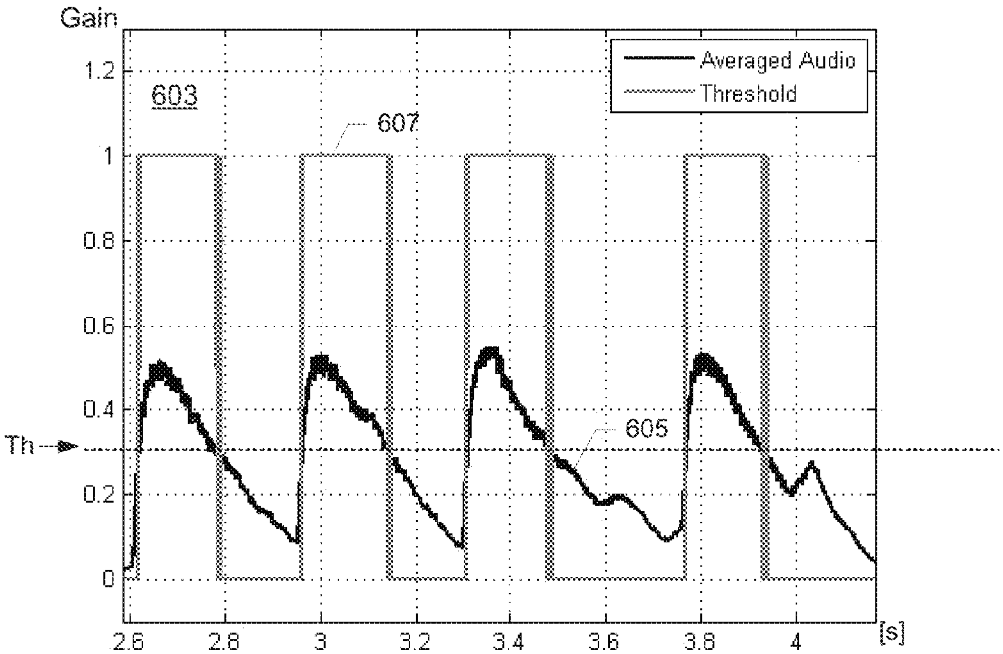

The waveform graphs 601 and 603 of FIG. 6 illustrates the principles and operation of the above-discussed embodiment of the voice coil temperature protector configured for adjusting the level of the low-frequency probe signal in dependence of the estimated or measured level of the audio signal.

The unit on the x-axis of each of waveform graphs 601 and 603 is time in seconds such that each entire plot spans over about 1.6 seconds. The y-axis of waveform graph 601 shows the amplitude of the applied audio signal, comprising a representative music signal, in normalized format, i.e. without an absolute voltage or current unit. The y-axis of waveform graph 603 represents the amplitude of the applied low-frequency probe signal in normalized format, i.e. without an absolute voltage or current unit, and the value of a gain constant as explained in further detail below. The upper waveform graph 601 comprises a first waveform 602, "Audio Signal" legend, which shows the unprocessed temporal waveform of the music signal itself while a second waveform 604, "Averaged Audio" legend, shows the determined level of the music signal represented by a running average level. The level of the low-frequency probe signal component of the composite loudspeaker drive signal is adjusted between a fixed value and zero based on whether the determined level 604 of the music signal waveform 602 lies above or below the indicated level threshold, Th, of about 0.3. The level adjustment of the low-frequency probe signal is in practice carried out in the digital domain by adjusting the value of a gain constant multiplied onto the low-frequency probe signal. This is illustrated by the second waveform 607, "Threshold" legend, of the lower waveform graph 603 which shows the value of the gain constant over time. The first waveform 605, "Averaged Audio" legend, of the lower waveform graph 605 shows once again the computed or determined running average level of the music signal. The running average level of the music signal as indicated by the first waveform 605 fluctuates between a maximum value of about 0.5 and a minimum value about 0.1 following the instantaneous amplitude and power of the temporal music signal waveform 602. The value of the gain constant varies between zero and 1 such that the gain constant is set to a constant 1.0 by the signal controller when the running average level of the music signal exceeds the indicated level threshold, Th, and set to zero when the running average level falls below the level threshold, Th, as illustrated. The skilled person will understand that the gain factor based adjustment of the level of the low-frequency probe signal is one of multiple options to achieve the desired running adjustment or adaptation of the level of the low-frequency probe signal to the level of the audio signal.

Figure 7:
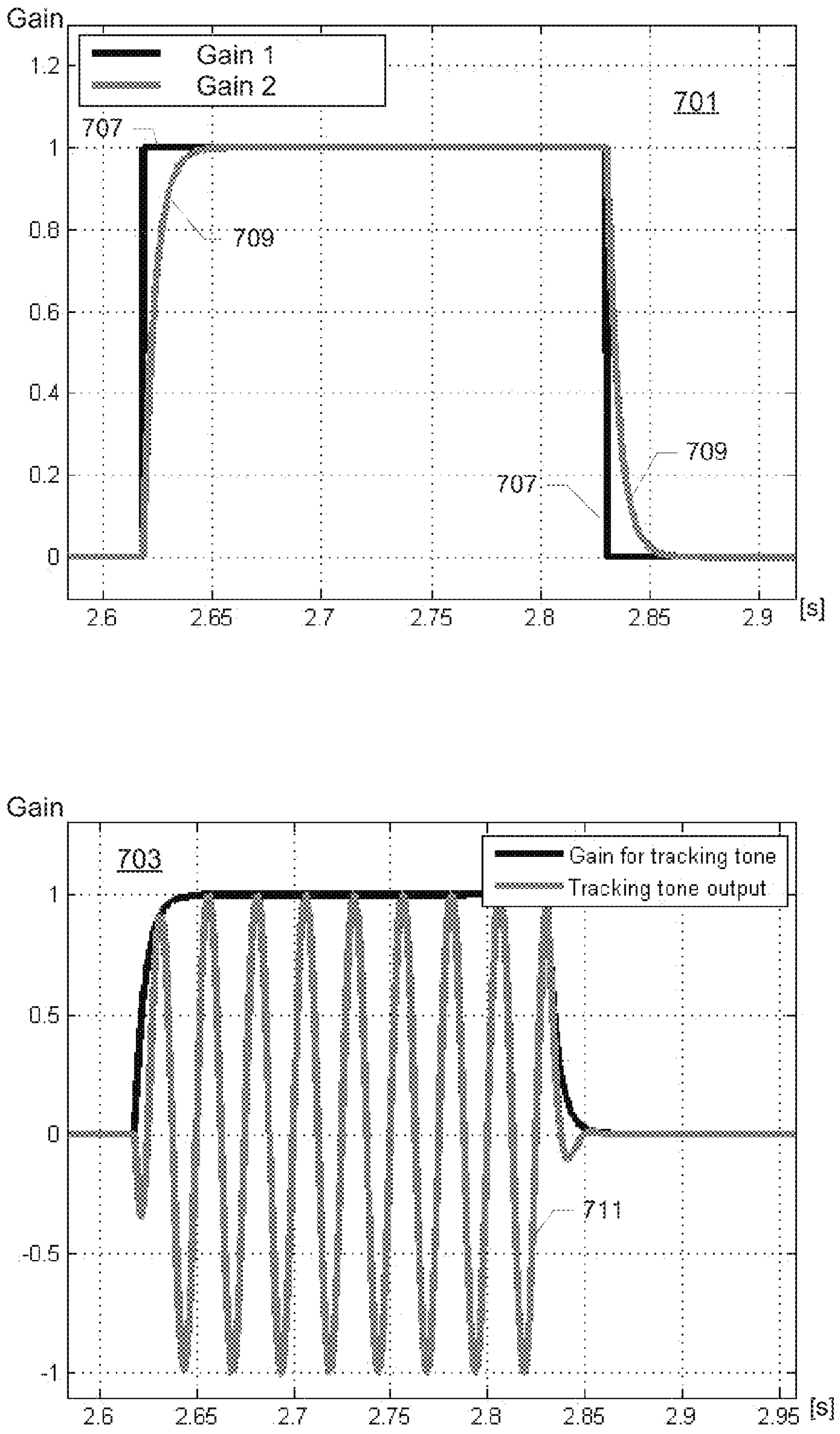
FIG. 7 shows various computed gain factor waveforms and a corresponding low-frequency probe signal waveform generated by a voice coil temperature protector in accordance with a second embodiment of the invention.

In a particular embodiment of the present invention, the gain factor based adjustment of the level of the low-frequency probe signal comprises a gradual transition from the first value to the second value of the gain constant, e.g. from 1.0 to zero and vice versa, at the crossing of the level threshold, Th. This gradual transition is helpful to reducing possible audible artefacts generated by an abrupt onset or removal of the low-frequency probe signal. This feature is illustrated with reference to waveform graphs 701 and 703 of FIG. 7. The upper waveform graph 701 comprises a first waveform 707, "Gain 1" legend, which shows the value of the previously discussed gain constant applied to the low-frequency probe signal in the previous embodiment with abrupt value transitions between 0 and 1.0. The second waveform 709, "Gain 2" legend, shows the value of the gain constant with smooth level transitions between gain constant values 0 and 1.0. The second waveform 709 shows an intermediate fading time periods of about 20-25 ms between each gain constant transition. When this gain constant waveform 709 is multiplied to the temporal waveform of the low-frequency probe signal, the resulting waveform of the latter is depicted as low-frequency probe signal waveform 711, "Tracking tone output" legend. In this case, the amplitude of the sine wave low-frequency probe signal exhibits a gradual increase or decrease of amplitude at the level transitions such that the waveform shape possesses the previously discussed advantages.

Figure 8:
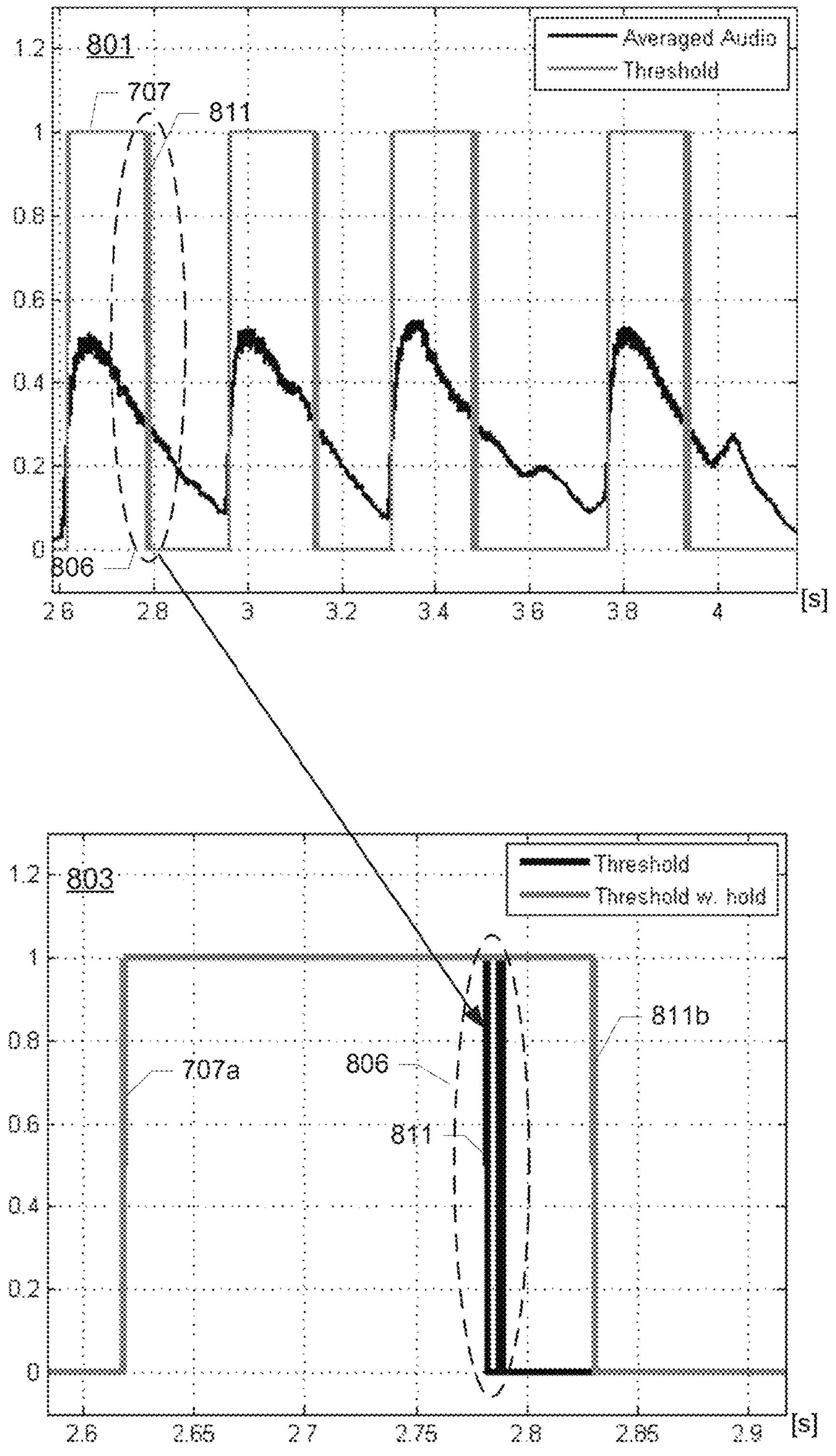
FIG. 8 shows various additional gain factor waveforms computed by a voice coil temperature protector in accordance with a third embodiment of the invention.

In yet another embodiment of the present invention the gain factor based adjustment of the level of the low-frequency probe signal comprises a certain predetermined time delay between the crossing of the level threshold, Th, and the actual transition of the gain constant, e.g. from 1.0 to zero or vice versa. This predetermined time delay can be viewed as a hold function or release time applied to the gain factor adjustment or adaptation. This time delay of the transition of the gain factor is helpful to reduce rapid random gain value transitions between the first and second values caused by overlaid noise or ripple on the determined level, or level estimate, of the audio signal music signal. This feature is illustrated with reference to waveform graphs 801 and 803 of FIG. 8. The upper waveform graph 801 corresponds to the waveform graph 603 discussed above. The dotted ellipse 806 highlights a gain transition waveform 811 between the first and second values of the gain constant. This gain transition waveform 811 exhibits numerous random gain transitions around the falling waveform edge 811 due to the rather noisy waveform of the audio signal level estimate. This phenomenon is more clearly illustrated by the same gain transition waveform 811 depicted on the zoomed time scale on the lower waveform graph 803. These random gain transitions have nearly been eliminated in the corresponding gain transition waveform 811*b* where the predetermined time delay is applied to the transition of the gain value or factor. The time delay is about 25 ms in the present example, but may vary depending on the application and nature of the audio signal, e.g. between 10 ms and 100 ms.

What is claimed is:

1. A method, comprising steps of:

adding a probe signal to a received speaker signal to generate a composite drive signal, applying the composite drive signal to a voice coil of a loudspeaker, detecting a voice coil current from the voice coil in response to the applied composite drive signal;

extracting, from the detected voice coil current, a level of probe signal current that corresponds to the probe signal portion of the composite drive signal, comparing the extracted level of the probe signal current to a threshold corresponding to a predetermined thermal state of the speaker, and attenuating a level of the speaker signal as applied to the loudspeaker based upon the comparison.

2. The method of claim 1, wherein the attenuating comprises attenuating a level of the speaker signal within a predetermined sub band of the speaker signal.

3. The method of claim 1, wherein the probe signal has a frequency at least five times smaller than a fundamental resonance frequency of the loudspeaker.

4. The method of claim 1, wherein the probe signal has a frequency that is within a substantially flat impedance frequency range of the loudspeaker.

5. The method of claim 1, wherein the probe signal has a period less than half a thermal time constant of the loudspeaker.

6. The method of claim 1, wherein the probe signal, when active, has uniform amplitude.

7. The method of claim 1, wherein the probe signal has an amplitude that varies with variations of the received speaker signal.

8. The method of claim 1, further comprising when the comparison indicates the loudspeaker is operating within its thermal limits, disabling the probe signal.

9. The method of claim 1, wherein the probe signal is a sine wave.

10. The method of claim 1, wherein the probe signal is a noise signal.

11. The method of claim 1, further comprising, prior to the adding:

detecting a level of the received speaker signal;

setting a level of the probe signal to a first level if the level of the received speaker signal exceeds a threshold; and setting the level of the probe signal to a second level, smaller than the first level, if the level of the received speaker signal is below the threshold.

12. The method of claim 11, wherein the detecting comprises detecting the level of the received speaker signal over a predetermined frequency sub-band.

13. A speaker monitor system, comprising:

a probe signal source configured to provide a probe signal;

a signal combiner having inputs for a speaker signal and for the probe signal from the probe signal source;

an amplifier having an input coupled to the signal combiner and an output for connection to a voice coil of a loudspeaker;

a detector having an input for a return signal from the voice coil of the loudspeaker, the detector configured to detect a portion of the return signal attributed to the probe signal;

a comparator having a first input configured to receive, from the detector, the detected portion of the return signal attributed to the probe signal and a second input configured to receive a threshold signal, the comparator configured to provide an output indicative of a relationship between the detected portion of the return signal attributed to the probe signal and the threshold signal; and a controller configured to update a speaker signal gain based on the output of the comparator.

14. The system of claim 13, wherein the controller attenuates a level of the speaker signal in response to the output of the comparator.

15. The system of claim 13, wherein the detector comprises a bandpass filter.

16. The system of claim 13, wherein the detector comprises a current sensor provided in a current path of the return signal, and an analog to digital converter having an input coupled to the current sensor.

17. The system of claim 13, wherein the detector comprises a resistor provided in a current path of the return signal.

18. The system of claim 13, wherein the detector comprises a current mirror provided in a current path of the return signal.

19. The system of claim 13, wherein the controller attenuates a level of the speaker signal in a sub band of the speaker signal.

20. The system of claim 13, wherein the probe signal source comprises a sine wave generator.

21. The system of claim 20, further comprising the loudspeaker, wherein the sine wave has a frequency at least five times smaller than a fundamental resonance frequency of the loudspeaker.

22. The system of claim 13, wherein the probe signal source comprises a noise generator.

23. A method comprising:

concurrently applying a loudspeaker drive signal and a probe signal to a voice coil of a loudspeaker, the loudspeaker drive signal including audible signal information and the probe signal including substantially inaudible, low-frequency signal information;

detecting a voice coil current signal from the voice coil in response to the concurrently applied loudspeaker drive signal and probe signal;

extracting, from the detected voice coil current signal, a probe current signal that corresponds to the applied probe signal; and selectively attenuating the loudspeaker drive signal based on a level of the extracted probe current signal.

24. The method of claim 23, wherein the concurrently applying the loudspeaker drive signal and the probe signal to the voice coil includes applying a probe signal that has a frequency that is at least five times smaller than a fundamental resonance frequency of the loudspeaker.

25. The method of claim 23, wherein the concurrently applying the loudspeaker drive signal and the probe signal to the voice coil includes applying a probe signal that has a frequency that is within a substantially flat impedance frequency range of the loudspeaker.

26. The method of claim 23, wherein the selectively attenuating the loudspeaker drive signal is based on a result of a comparison of the level of the extracted probe current signal and a specified threshold, the specified threshold determined based on a known temperature dependency of a resistance of the voice coil.

27. The method of claim 23, wherein the probe signal includes substantially inaudible signal information between about 0.25 Hz and 20 Hz.

28. The method of claim 1, wherein the adding the probe signal to the received speaker signal includes adding an AC probe signal having a frequency between about 0.25 Hz and 20 Hz to the received speaker signal.

29. The speaker monitor system of claim 13, wherein the probe signal source is configured to provide an AC probe signal having a frequency between about 0.25 Hz and 20 Hz.

* * * * *